United States Patent [19]
Lin et al.

[11] Patent Number: 5,888,124
[45] Date of Patent: Mar. 30, 1999

[54] APPARATUS FOR POLISHING AND CLEANING A WAFER

[75] Inventors: Bih-Tiao Lin, Ping Tung; Fu-Liang Yang, Tainan, both of Taiwan

[73] Assignee: Vanguard International Semiconductor Corporation, Hsinchu, Taiwan

[21] Appl. No.: 938,234

[22] Filed: Sep. 26, 1997

[51] Int. Cl.⁶ .................. B24B 7/04; B24B 7/22
[52] U.S. Cl. .................. 451/67; 451/288; 134/184
[58] Field of Search .................. 451/67, 288; 134/184

[56] References Cited

U.S. PATENT DOCUMENTS

| | | |
|---|---|---|
| 4,854,337 | 8/1989 | Bunkenburg et al. .................. 134/184 |
| 5,247,954 | 9/1993 | Grant et al. .................. 134/184 |
| 5,618,227 | 4/1997 | Tsutsumi et al. .................. 451/288 |
| 5,655,954 | 8/1997 | Oishi et al. .................. 451/67 |
| 5,681,396 | 10/1997 | Madanshetty .................. 134/184 |

*Primary Examiner*—David A. Scherbel
*Assistant Examiner*—Shantese McDonald
*Attorney, Agent, or Firm*—Christensen O'Connor Johnson & Kindness PLLC

[57] ABSTRACT

An apparatus for polishing and cleaning a semiconductor wafer (3028) is disclosed to substantially improve the efficiency of chemical-mechanical polishing. The apparatus reduces contamination to a clean room during fabrication of VLSI circuits. The apparatus includes a table (3026) supporting the wafer, and a polishing pad (3024) disposed on a surface of the wafer. The polishing pad performs chemical-mechanical polishing on the surface of the wafer. Further, at least one cleaning head (3042, 3044, 3046) is provided for cleaning the surface of the wafer. The wafer and the cleaning head are housed in a chamber (30). A guiding means (32) is used for guiding the cleaning head over the wafer to clean the surface of the wafer.

19 Claims, 4 Drawing Sheets

APPARATUS FOR POLISHING AND CLEANING A WAFER

BACKGROUND OF THE INVENTION

1. Field of the Invention

The present invention relates to chemical-mechanical polishing and, more particularly, to an apparatus for polishing and cleaning a semiconductor wafer.

2. Description of the Prior Art

Silicon wafers used for very large scale integration (VLSI) circuits are ideally flat. However, after many process steps, such as growth or deposition of various insulating and conductive layers, a nonplanar structure is usually formed. For example, the gate oxide of a metal oxide semiconductor (MOS) transistor is only 100–250 angstroms thick, whereas the field oxide may be 10,000 angstroms thick. The nonplanarity primarily results in two problems. The first problem is the difficulty of maintaining step coverage without breaks in the continuity of fine lines. The second problem is the inability to lithographically transfer fine-line patterns to the wafer.

More specifically, lithography techniques have steadily shifted toward the use of shorter wavelengths, such as the deep ultraviolet (DUV), in order to reduce minimum feature size. Unfortunately, decreasing the wavelength results in reducing the depth of focus (DOF). The depth of focus is an important parameter because the surface of a microcircuit has a nonplanar topographical surface. Therefore, the number of photolithography steps required to cover the microcircuit is increased, thereby increasing the time required to fabricate the microcircuit.

Techniques for planarization have been proposed to address the disadvantages associated with nonplanar surfaces. Chemical-mechanical polishing (CMP) is one of many conventional planarizing techniques used in fabricating VLSI circuits. Chemical-mechanical polishing is used as an attempt to attain a planar surface over the entire semiconductor substrate. FIG. 1A shows a cross-sectional view of a conventional CMP apparatus 10, which includes a rotating table 12 having a polishing pad 14 disposed thereon, and a rotating holder 16 that holds a wafer 18. A predetermined pressure is exerted on the wafer 18 by the polishing pad 14. As shown in FIG. 1B, a magnified cross-sectional view, an appropriate slurry 19 is applied between the wafer 18 and the polishing pad 14.

As the size of wafers has increased, a different kind of CMP apparatus 20 has been proposed to improve polishing efficiency. This CMP apparatus 20 includes a rotating table 26 that has a wafer 28 disposed thereon, and a holder 22, which is rotating or stationary, for holding a polishing pad 24. A simplified top view of this CMP apparatus 20 is shown in FIG. 2B, illustrating only the wafer 28 and the polishing pad 24.

During the polishing process, the CMP apparatus 10 (FIG. 2A) and the CMP apparatus 20 (FIG. 2A) will generate, either chemically or mechanically, unwanted particles. Such particles represent impurity concentrations that, however slight, can degrade the performance of VLSI circuits. Therefore, cleaning is essential to remove the unwanted particles and to achieve high production yield and device reliability.

In the conventional CMP process, the polished or unfinished wafers are removed from the CMP apparatus to a cleaner where some particle removal method, such as scrubbing and rinsing, is applied to remove the unwanted particles. To adequately complete the CMP process, a wafer must typically be subjected to the cleaning steps involving the CMP apparatus and the cleaner numerous times. Repeated transferring of the wafers back and forth between the CMP apparatus and the cleaner undesirably reduces production efficiency. Moreover, the transferring of the wafers further contaminates the clean environment necessary during VLSI fabrication.

SUMMARY OF THE INVENTION

In accordance with the present invention, an apparatus is provided for performing chemical-mechanical polishing and cleaning that substantially increases the efficiency of the chemical-mechanical polishing process. The apparatus also reduces contamination to a clean room during fabrication of VLSI circuits. In one embodiment, the present invention includes a rotating table supporting the wafer, and a polishing pad disposed on a surface of the wafer. The polishing pad performs chemical-mechanical polishing on the surface of the wafer. At least one cleaning head is provided for cleaning the surface of the wafer. The wafer and the cleaning head are housed in a chamber. A guiding means is used for guiding the cleaning head according to a predetermined direction and path so that the cleaning head is guided over the wafer to clean the surface of the wafer. The cleaning head is moved away from the wafer and in the chamber while the wafer is polished. In this embodiment, the cleaning head could be a brush for mechanically scrubbing the surface of the wafer, a chemical cleaning nozzle for applying a chemical on the surface of the wafer, or a megasonic/ultrasonic cleaning head for providing sonic waves to clean the surface of the wafer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
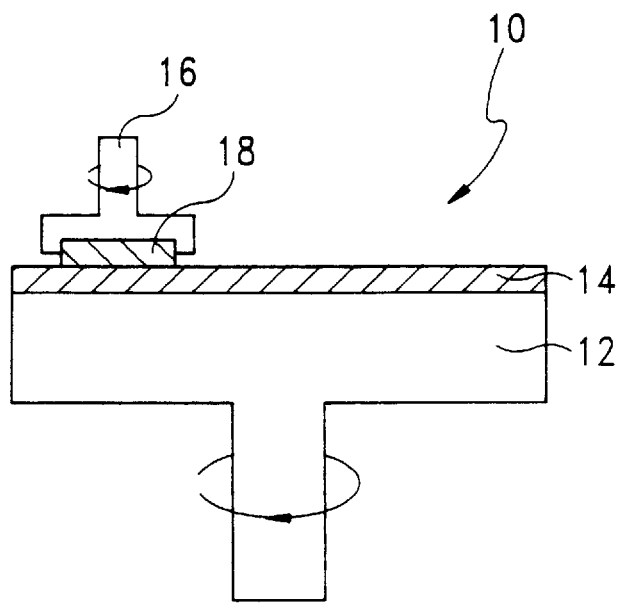
FIG. 1A shows a cross-sectional view of a conventional CMP apparatus.
Figure 1B:
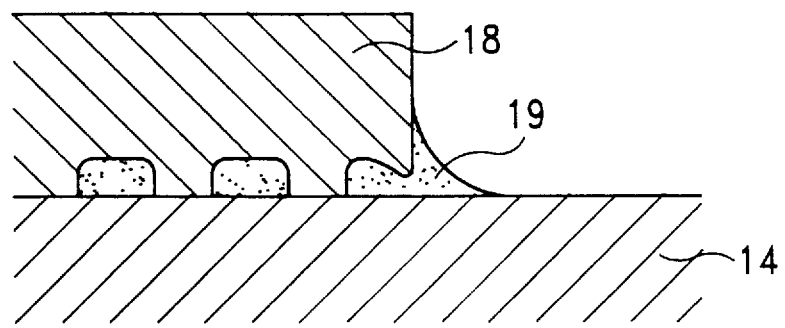
FIG. 1B shows a magnified cross section of the conventional CMP apparatus of FIG. 1A.
Figure 2A:
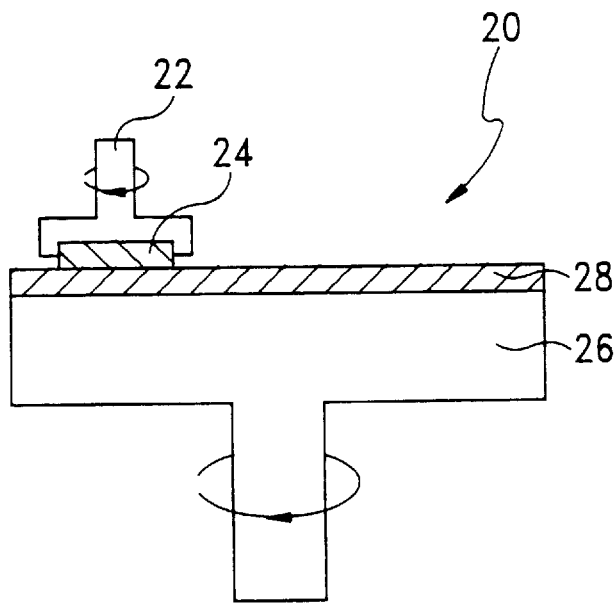
FIG. 2A shows a cross-sectional view of another conventional CMP apparatus.
Figure 2B:
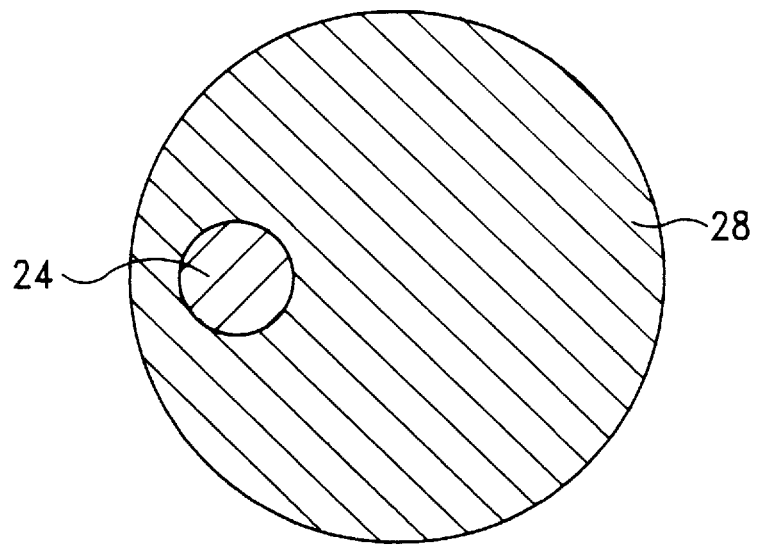
FIG. 2B shows a top view of the conventional CMP apparatus of FIG. 2A.
Figure 3:
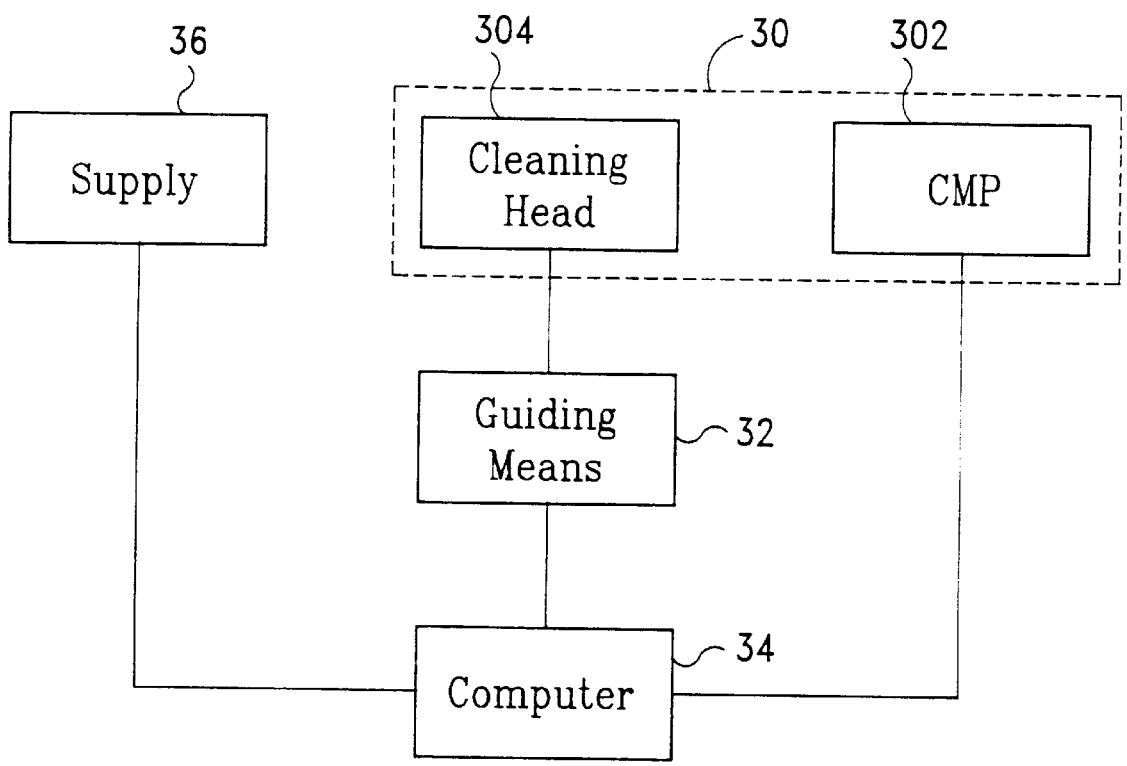
FIG. 3 shows a block diagram illustrating a chemical-mechanical polishing (CMP) apparatus according to one embodiment of the present invention.

FIG. 3 shows a block diagram illustrating a chemical-mechanical polishing (CMP) apparatus according to one embodiment of the present invention. The CMP apparatus primarily includes a chamber 30, which houses a polishing portion 302 and a cleaning portion 304. The CMP process includes a polishing mode and a cleaning mode. The polishing portion 302 is used during the polishing mode. The cleaning portion 304 is used during the cleaning mode.

Figure 4A:
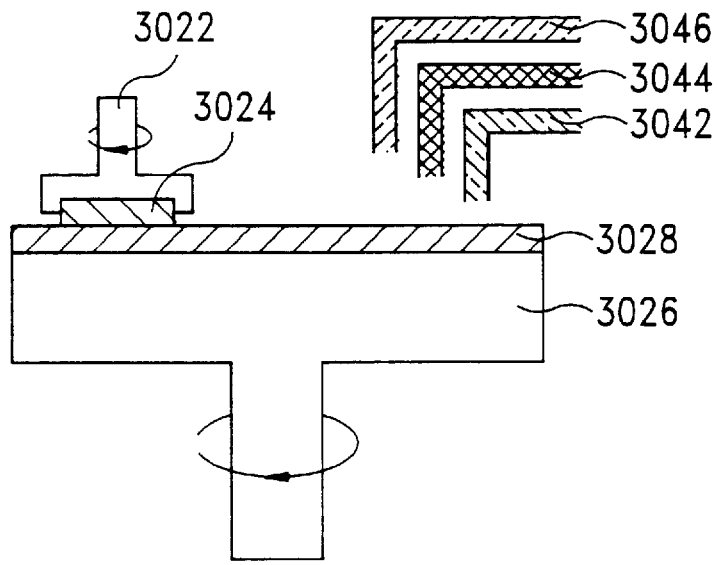
FIG. 4A shows a cross-sectional view of a chamber in the CMP apparatus according to the embodiment of the present invention.
Figure 4B:
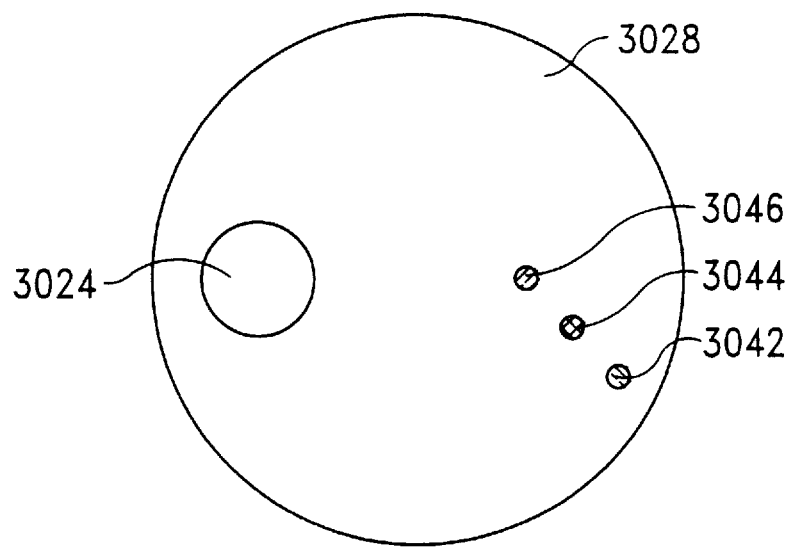
FIG. 4B shows a top view of the chamber in FIG. 4A.

As shown in FIG. 4A, a cross-sectional view of the polishing pad, the polishing portion 302 includes a rotating table 3026; a wafer 3028 disposed on the rotating table 3026; a holder 3022 that is rotating or stationary; and a polishing pad 3024 held by the holder 3022. A simplified top view of the polishing portion 302 is shown in FIG. 4B, wherein only the wafer 3028 and the polishing pad 3024 are shown. Referring to FIG. 3, the cleaning portion 304 includes at least one cleaning head. In one embodiment of the present invention, a brush 3042, a chemical cleaning nozzle 3044, and an ultrasonic/megasonic cleaning head 3046 (FIG. 4A and FIG. 4B) are preferably used to remove unwanted particulates generated during the CMP process. The brush 3042, the chemical cleaning nozzle 3044, and the ultrasonic/megasonic cleaning head 3046 all function as cleaning heads to clean the surface of the wafer 3028. As shown in FIG. 3, each of the cleaning heads in the cleaning portion 304 is capable of being moved by a guiding means 32. The guiding means 32 is controlled by a computer 34, such as a general-purpose personal computer. The computer 34 also controls the polishing process of the polishing portion 302, and controls a supply 36 of, for example, chemical solution or de-ionized water provided to the cleaning portion 304. It will be appreciated that the guiding means 32 may be cooperatively implemented for use with a suitable conventional apparatus, such as an automatic guiding vehicle (AGV).

During the polishing mode, the cleaning heads 3042, 3044, and 3046 are preferably moved away from the wafer 3028 to a corner of the chamber 30. Further, a slurry is typically applied to chemically interact with the surface of the wafer 3028. It will be appreciated that the polishing layer of the wafer 3028 is not limited to dielectrics. Other materials and structures, such as various metal films or trenches filled with polysilicon or oxide, may also be polished according to one embodiment of the present invention.

During the cleaning mode, some or all of the cleaning heads 3042, 3044, 3046 of the cleaning portion 304 are guided over the wafer 3028 by the guiding means 32. Specifically, in one embodiment of the present invention, the brush 3042, which is rotating or stationary, is guided near the surface of the wafer 3028 with high-pressure deionized water to displace the unwanted particles thereon. This method for removing the unwanted particles, typically referred to as mechanical scrubbing, is generally effective for removing particles greater than about 0.2 $\mu$m. The chemical cleaning nozzle 3044 is used to apply a chemical, such as surfactant, hot alkaline or acidic hydrogen peroxide ($H_2O_2$), that chemically interacts with the surface of the wafer 3028 to clean the surface of the wafer 3028 while preventing surface damage to the wafer 3028. The ultrasonic/megasonic cleaning head 3046 is effective for removing particles less than about 0.15 $\mu$m. A megasonic scrubbing process typically uses sonic waves of about 850 to 900 kHz, and the ultrasonic scrubbing process typically uses sonic waves of about 1 to 80 MHz.

It will be appreciated that the cleaning head 3042, 3044, or 3046 may be guided over the wafer 3028 in a specified direction and path determined by the computer 34 that controls the guiding means 32. It will also be appreciated that, under certain situations, some of the cleaning heads 3042, 3044, and 3046 may be moved over the wafer 3028 for use during the polishing mode. Therefore, the chemical-mechanical polishing in accordance with the present invention becomes efficient without transferring the wafer back and forth between the polishing mode and the cleaning mode in a clean room. Furthermore, the integrity of the clean room may be preserved without being contaminated by unwanted particles.

While the preferred embodiment of the invention has been illustrated and described, it will be appreciated that various changes can be made therein without departing from the spirit and scope of the invention.

What is claimed is:

1. An apparatus for polishing and cleaning a semiconductor wafer, said apparatus comprising:

a table supporting the wafer;

a polishing pad disposed on a surface of the wafer, said polishing pad for chemical-mechanical polishing the surface of the wafer;

at least one cleaning head for cleaning the surface of the wafer, the wafer and said at least one cleaning head housed in a chamber; and means for guiding said at least one cleaning head over the wafer to clean the surface of the wafer, said means for guiding cooperatively attached to said at least one cleaning head for performing a cleaning process to the wafer on said table without transferring the wafer between stations during a change from a polishing mode and a cleaning mode.

2. The apparatus according to claim 1, further comprising a computer, coupled to said means for guiding, for controlling said means for guiding to direct said at least one cleaning head according to a predetermined direction and path.

3. The apparatus according to claim 1, wherein said at least one cleaning head is moved away from the wafer and in the chamber while the wafer is being polished.

4. The apparatus according to claim 1, wherein said table is rotating.

5. The apparatus according to claim 1, wherein said at least one cleaning head is rotating.

6. The apparatus according to claim 1, wherein said at least one cleaning head is stationary.

7. The apparatus according to claim 1, wherein said at least one cleaning head includes a brush for mechanically scrubbing the surface of the wafer.

8. The apparatus according to claim 1, wherein said at least one cleaning head includes a chemical cleaning nozzle for applying a chemical on the surface of the wafer.

9. The apparatus according to claim 1, wherein said at least one cleaning head includes a sonic cleaning head for providing sonic waves to clean the surface of the wafer.

10. The apparatus according to claim 9, wherein said sonic waves include megasonic waves having a frequency of approximately 850 to 900 kHz.

11. The apparatus according to claim 9, wherein said sonic waves include ultrasonic waves having a frequency of approximately 1 to 80 MHz.

12. An apparatus for polishing and cleaning a semiconductor wafer, said apparatus comprising:

a rotating table supporting the wafer;

a polishing pad disposed on a surface of the wafer, said polishing pad for chemical-mechanical polishing the surface of the wafer on said rotating table;

at least one cleaning head for cleaning the surface of the wafer on said rotating table, the wafer and said at least one cleaning head housed in a chamber; and means for guiding said at least one cleaning head according to a predetermined direction and path so that said at least one cleaning head is guided over the wafer to clean the surface of the wafer, said means for guiding cooperatively attached to said at least one cleaning head for performing a cleaning process to the wafer on said table without transferring the wafer between stations during a change from a polishing mode and a cleaning mode, said at least one cleaning head being moved away from the wafer and in the chamber while the wafer is being polished.

13. The apparatus according to claim 12, wherein said at least one cleaning head is rotating.

14. The apparatus according to claim 12, wherein said at least one cleaning head is stationary.

15. The apparatus according to claim 12, wherein said at least one cleaning head includes a brush for mechanically scrubbing the surface of the wafer.

16. The apparatus according to claim 12, wherein said at least one cleaning head includes a chemical cleaning nozzle for applying a chemical on the surface of the wafer.

17. The apparatus according to claim 12, wherein said at least one cleaning head includes a sonic cleaning head for providing sonic waves to clean the surface of the wafer.

18. The apparatus according to claim 17, wherein said sonic waves include megasonic waves having a frequency of approximately 850 to 900 kHz.

19. The apparatus according to claim 17, wherein said sonic waves include ultrasonic waves having a frequency of approximately 1 to 80 MHz.

* * * * *